(12) United States Patent  
Kim et al.

(10) Patent No.: US 12,394,700 B2
(45) Date of Patent: Aug. 19, 2025

(54) SEMICONDUCTOR PACKAGE

(71) Applicant: Samsung Electronics Co., Ltd., Suwon-si (KR)

(72) Inventors: Dongkyu Kim, Anyang-si (KR); Seokhyun Lee, Hwaseong-si (KR); Kyoung Lim Suk, Suwon-si (KR); Jaegwon Jang, Hwaseong-si (KR); Gwangjae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/374,396

(22) Filed: Sep. 28, 2023

(65) Prior Publication Data

US 2024/0030119 A1 Jan. 25, 2024

Related U.S. Application Data

(63) Continuation of application No. 17/177,305, filed on Feb. 17, 2021, now Pat. No. 11,804,427.

(30) Foreign Application Priority Data

Jun. 22, 2020 (KR) .................. 10-2020-0076011

(51) Int. Cl.
H01L 23/498 (2006.01)
H01L 23/00 (2006.01)
H01L 25/065 (2023.01)

(52) U.S. Cl.
CPC .. *H01L 23/49822* (2013.01); *H01L 23/49833* (2013.01); *H01L 23/49894* (2013.01);
(Continued)

(58) Field of Classification Search
None
See application file for complete search history.

(56) References Cited

U.S. PATENT DOCUMENTS 5,905,308 A 5/1999 Efland et al.
8,143,534 B2 3/2012 Hando et al.
(Continued)

FOREIGN PATENT DOCUMENTS

KR 100895816 B1 5/2009
KR 1020200029088 A 3/2020
KR 1020200069710 A 6/2020

*Primary Examiner* — Hung K Vu
(74) *Attorney, Agent, or Firm* — Muir Patent Law, PLLC

(57) ABSTRACT

A semiconductor package may include a redistribution substrate, a connection terminal, and a semiconductor chip sequentially stacked. The redistribution substrate may include an insulating layer, a plurality of redistribution patterns, which are vertically stacked in the insulating layer, and each of which includes interconnection and via portions, and a bonding pad on the interconnection portion of the topmost redistribution pattern. The topmost redistribution pattern and the bonding pad may include different metallic materials. The bonding pad may have first and second surfaces opposite to each other. The first surface of the bonding pad may be in contact with a top surface of the interconnection portion of the topmost redistribution pattern. A portion of the second surface of the bonding pad may be in contact with the connection terminal. The insulating layer may be extended to be in contact with the remaining portion of the second surface.

20 Claims, 17 Drawing Sheets

(52) U.S. Cl.
CPC ............... *H01L 24/16* (2013.01); *H01L 24/32* (2013.01); *H01L 25/0657* (2013.01); *H01L 2224/16227* (2013.01); *H01L 2224/32225* (2013.01)

(56) References Cited

U.S. PATENT DOCUMENTS

| | | |
|---|---|---|
| 8,309,372 B2 | 11/2012 | Lee |
| 9,412,712 B2 | 8/2016 | Jang et al. |
| 9,484,327 B2 * | 11/2016 | Kim ................ H01L 25/03 |
| 9,530,739 B2 | 12/2016 | Song et al. |
| 9,613,922 B2 | 4/2017 | Kado et al. |
| 10,930,625 B2 | 2/2021 | Suk et al. |
| 11,031,375 B2 | 6/2021 | Lee et al. |
| 2006/0267198 A1 | 11/2006 | Lin et al. |
| 2007/0205520 A1 * | 9/2007 | Chou ................ H01L 24/12 |
| | | 257/E23.129 |
| 2018/0158777 A1 | 6/2018 | Chen et al. |
| 2019/0295986 A1 | 9/2019 | Oh et al. |
| 2020/0091113 A1 | 3/2020 | Chen et al. |
| 2020/0135653 A1 | 4/2020 | Tsai et al. |
| 2021/0257223 A1 | 8/2021 | Park et al. |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2020-0076011, filed on Jun. 22, 2020, in the Korean Intellectual Property Office, the entire contents of which are hereby incorporated by reference.

BACKGROUND OF THE INVENTION

The present disclosure relates to a semiconductor package.

A semiconductor package is configured to allow a semiconductor chip to be easily used as a part of an electronic product. Conventionally, the semiconductor package includes a printed circuit board (PCB) and a semiconductor chip, which is mounted on the PCB and is electrically connected to the PCB using bonding wires or bumps. With development of the electronics industry, many studies are being conducted to improve reliability of the semiconductor package and to reduce a size of the semiconductor package.

SUMMARY

An embodiment of the inventive concept provides a semiconductor package with improved reliability.

According to an embodiment of the inventive concept, a semiconductor package may include a first redistribution substrate, a first semiconductor chip on the first redistribution substrate, and a connection terminal between the first redistribution substrate and the first semiconductor chip. The first redistribution substrate may include a first insulating layer, a plurality of first redistribution patterns, which are vertically stacked in the first insulating layer, and each of which includes a plurality of interconnection portions and a plurality of via portions, and a first bonding pad on a first interconnection portion of a topmost one of the first redistribution patterns. The topmost first redistribution pattern may include a first metallic material and the first bonding pad may include a second metallic material that is different from the first metallic material. The first bonding pad may have a first surface and a second surface, which are opposite to each other. The first surface of the first bonding pad may be in contact with a top surface of the first interconnection portion of the topmost first redistribution pattern. A center portion of the second surface of the first bonding pad may be in contact with the connection terminal. The first insulating layer may be extended to be in contact with an edge portion of the second surface of the first bonding pad.

According to an embodiment of the inventive concept, a semiconductor package may include a first redistribution substrate having a first surface and a second surface, which are opposite to each other, a first semiconductor chip disposed on the first surface of the first redistribution substrate to have chip pads facing the first surface of the first redistribution substrate, and outer coupling terminals on the second surface of the first redistribution substrate. The first redistribution substrate may include a first insulating layer, a plurality of first redistribution patterns, which are vertically stacked in the first insulating layer, and each of which includes a plurality of interconnection portions and a plurality of via portions, and an under-bump pattern between the outer coupling terminals and a first interconnection portion of one of the first redistribution patterns, which is adjacent to the second surface of the first redistribution substrate. A first via portion of an uppermost redistribution pattern, which is adjacent to the first surface of the first redistribution substrate, may be in contact with one of the chip pads. The under-bump pattern may have a first surface and a second surface, which are opposite to each other. The first surface of the under-bump pattern may be in contact with a bottom surface of a lowermost interconnection portion of one of the first redistribution patterns, which is adjacent to the second surface of the first redistribution substrate. The first insulating layer may be extended to cover an edge portion of the second surface of the under-bump pattern.

According to an embodiment of the inventive concept, a semiconductor package may include a first semiconductor package and a second semiconductor package on the first semiconductor package. The first semiconductor package may include a first redistribution substrate, a first semiconductor chip on the first redistribution substrate, a second redistribution substrate, which is spaced apart from the first redistribution substrate, with the first semiconductor chip interposed therebetween, a connection terminal between the first redistribution substrate and the first semiconductor chip, and a conductive pillar between the first redistribution substrate and the second redistribution substrate. The first redistribution substrate may include a first redistribution pattern and a second redistribution pattern, which are vertically stacked and each of which includes a plurality of via portions and a plurality of interconnection portions, a first bonding pad in contact with a top surface of a first interconnection portion of the second redistribution pattern, and an insulating layer covering the first and second redistribution patterns and a portion of a top surface of the first bonding pad. The insulating layer may be absent between the first bonding pad and the second redistribution pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
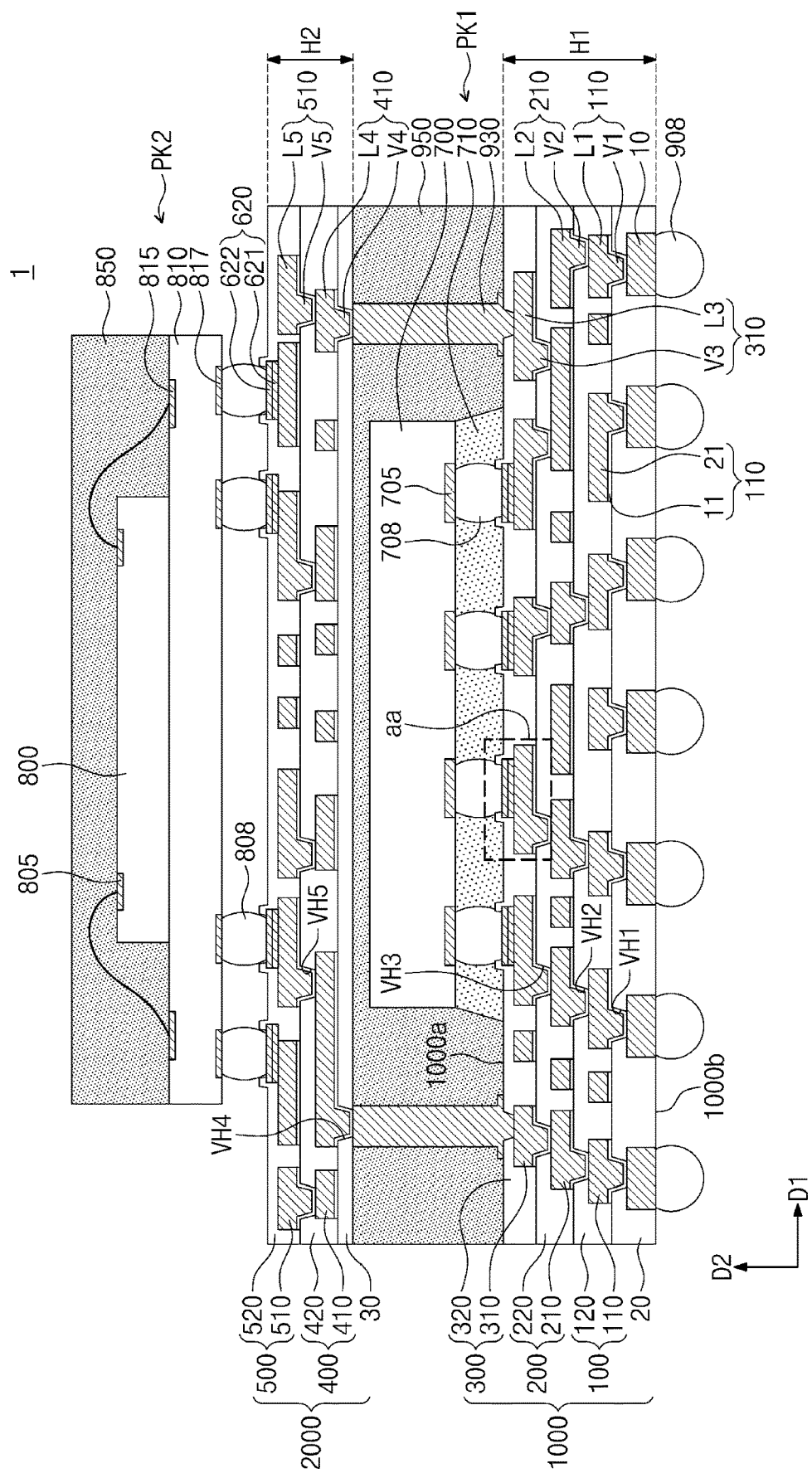
FIG. 1 is a sectional view illustrating a semiconductor package according to an embodiment of the inventive concept.

FIG. 1 is a sectional view illustrating a semiconductor package according to an embodiment of the inventive concept.

Referring to FIG. 1, a semiconductor package 1 may include a first semiconductor package PK1 and a second semiconductor package PK2 on the first semiconductor package PK1. The semiconductor package 1 may have a package-on-package structure. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first semiconductor package PK1 may include a lower redistribution substrate 1000, a first semiconductor chip 700, an upper redistribution substrate 2000, a conductive pillar 930, and a first molding member 950.

The lower redistribution substrate 1000 may include a first protection layer 20, a first redistribution layer 100, a second redistribution layer 200, and a third redistribution layer 300, which are sequentially stacked. FIG. 1 illustrates an example, in which the lower redistribution substrate 1000 includes three redistribution layers, but the inventive concept is not limited to this example. For example, one or more redistribution layers may be further provided or may be omitted.

The lower redistribution substrate 1000 may have a first surface 1000a and a second surface 1000b, which are opposite to each other. A direction, which is parallel to the first surface 1000a of the lower redistribution substrate 1000, may be defined as a first direction D1. A direction, which is perpendicular to the first surface 1000a of the lower redistribution substrate 1000, may be defined as a second direction D2.

A thickness H1 of the lower redistribution substrate 1000 in the second direction D2 may range from about 40 μm to 60 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In the present specification, the lower redistribution substrate 1000 and the upper redistribution substrate 2000 should not be understood as a conventional printed circuit board (PCB). For example, the lower redistribution substrate 1000 and the upper redistribution substrate 2000 may not include a core layer including an epoxy compound impregnated with glass fibers.

Under-bump patterns 10 may be provided in the first protection layer 20. The first protection layer 20 may include at least one of photo-sensitive polyimide, poly(benzoxazole), phenol-based polymers, or benzocyclobutene-based polymers. The under-bump patterns 10 may be formed of or include, for example, copper.

The first redistribution layer 100 may include first redistribution patterns 110 and a first insulating layer 120. The second redistribution layer 200 may include second redistribution patterns 210 and a second insulating layer 220. The third redistribution layer 300 may include third redistribution patterns 310 and a third insulating layer 320.

The first insulating layer 120, the second insulating layer 220, and the third insulating layer 320 may include at least one of photo-sensitive polyimide, poly(benzoxazole), phenol-based polymers, or benzocyclobutene-based polymers.

In an embodiment, there may be no measurable interface between any of the first protection layer 20 and the first to third insulating layers 120, 220, and 320. That is, the first protection layer 20 and the first to third insulating layers 120, 220, and 320 may be considered as a single insulating layer.

Each of the first to third redistribution patterns 110, 210, and 310 may include seed/barrier patterns 11 and conductive patterns 21. The seed/barrier patterns 11 may be formed of or include at least one of copper or titanium. The conductive patterns 21 may be formed of or include copper.

There may be a measurable interface between each seed/barrier pattern 11 and a respective conductive pattern 21. The seed/barrier pattern 11 may be locally provided on a bottom surface of the conductive pattern 21. The seed/barrier pattern 11 may not be provided on a side surface of the conductive pattern 21. Thus, a bottom surface of each of the conductive patterns 21 may be in contact with a respective seed/barrier pattern 11, and the side surface of each of the conductive patterns 21 may be in contact with the insulating layer 120, 220, or 320. It should be appreciated that use of the singular form of an object/element in this application (e.g., "conductive pattern 21") may apply to all of a plurality of like objects/elements (e.g., to all of the plurality of conductive patterns 21, such as those shown in the figures) unless context dictates otherwise.

Each of the first redistribution patterns 110 may include a first via portion V1 and a first interconnection portion L1, which are directly connected to each other to form a single object. The first via portion V1 may fill a first via hole VH1 in the first protection layer 20 and may be in contact with a top surface of the under-bump pattern 10. The first interconnection portion L1 may be provided on a top surface of the first protection layer 20 and the first via portion V1 and may be directly connected to the first via portion V1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the second redistribution patterns 210 may include a second via portion V2 and a second interconnection portion L2, which are directly connected to each other to form a single object. The second via portion V2 may fill a second via hole VH2 in the first insulating layer 120 and may be in contact with a top surface of the first interconnection portion L1 of the first redistribution pattern 110. The second interconnection portion L2 may be provided on a top surface of the first insulating layer 120 and the second via portion V2 and may be directly connected to the second via portion V2.

Each of the third redistribution patterns 310 may include a third via portion V3 and a third interconnection portion L3, which are directly connected to each other to form a single object. The third via portion V3 may fill a third via hole VH3 in the second insulating layer 220 and may be in contact with a top surface of the second interconnection portion L2 of the second redistribution pattern 210. The third interconnection portion L3 may be provided on a top surface of the second insulating layer 220 and the third via portion V3 and may be directly connected to the third via portion V3.

In the present specification, the via portions constituting the redistribution patterns may be locally provided between the interconnection portions that are vertically adjacent to each other. Thus, according to an embodiment of the inventive concept, each of the individual vias do not penetrate a plurality of the insulating layers 120, 220, or 320.

The third redistribution patterns 310 may be the topmost redistribution patterns of the redistribution patterns 110, 210, and 310. For example, the third redistribution patterns 310 may be the redistribution patterns, of the redistribution patterns 110, 210, and 310, that are disposed closest to the first surface 1000a of the lower redistribution substrate 1000.

The first redistribution patterns 110 may be the bottommost redistribution patterns of the redistribution patterns 110, 210, and 310. For example, the first redistribution patterns 110 may be redistribution patterns that are disposed closest to the second surface 1000b of the lower redistribution substrate 1000.

Figure 2A:
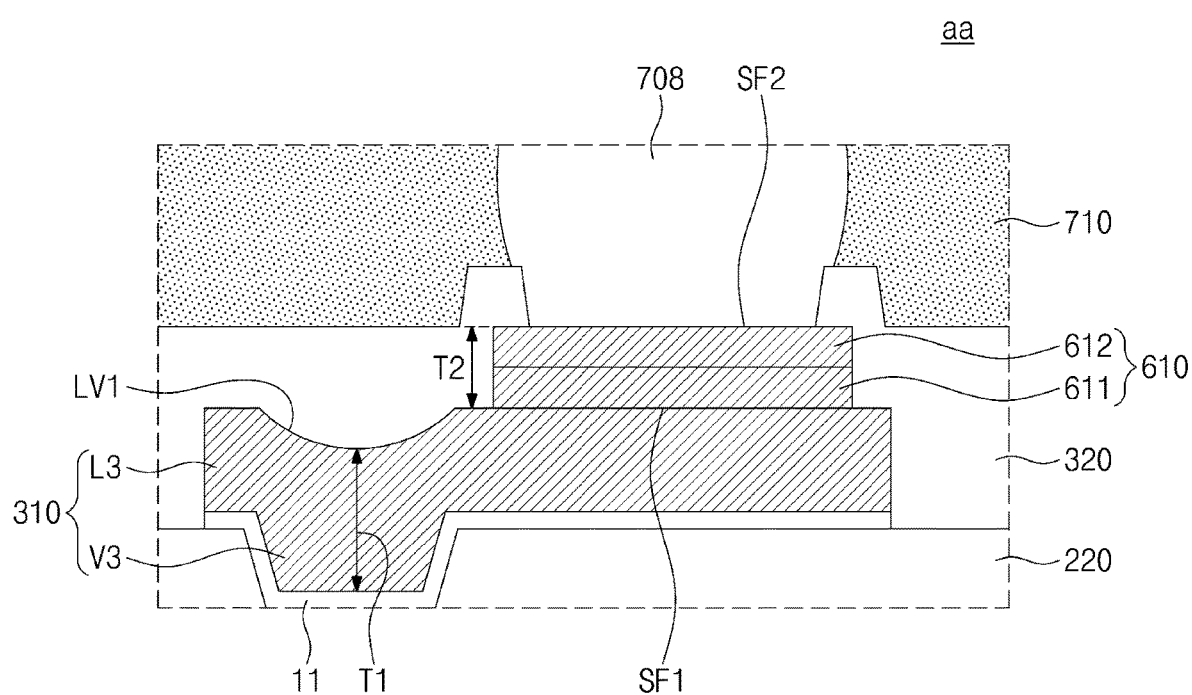
FIG. 2A is an enlarged sectional view of a portion 'aa' of FIG. 1.

FIG. 2A is an enlarged sectional view of a portion 'aa' of FIG. 1. Referring to FIG. 2A, a first bonding pad 610 may be provided on the third interconnection portion L3 of the third redistribution pattern 310.

The first bonding pad 610 may include a first surface SF1 and a second surface SF2, which are opposite to each other. The first surface SF1 of the first bonding pad 610 may be in contact with a top surface of the third interconnection portion L3. A portion of the second surface SF2 of the first bonding pad 610 may be in contact with a connection terminal 708, which will be described below. The remaining portion of the second surface SF2 of the first bonding pad 610 may be in contact with the third insulating layer 320. In detail, a center portion of the second surface SF2 of the first bonding pad 610 may be in contact with the connection terminal 708, and an edge portion of the second surface SF2 of the first bonding pad 610 and a side surface of the first bonding pad 610 may be in contact with the third insulating layer 320.

The first bonding pad 610 may include a first metal pattern 611 and a second metal pattern 612. The third interconnection portion L3 and the first metal pattern 611 of the first bonding pad 610 may be in contact with each other, without any via interposed therebetween.

Each of the first and second metal patterns 611 and 612 may be formed of or include a metallic material, which is different from the material (e.g., copper) of the conductive pattern 21. The first metal patterns 611 may be formed of or include a first metallic material. The second metal patterns 612 may be formed of or include a second metallic material. The first metallic material and the second metallic material may be different. In an embodiment, the first metal pattern 611 may be formed of or include nickel (Ni), and the second metal pattern 612 may be formed of or include gold (Au). The first metal pattern 611 may be used as a barrier layer preventing a material (e.g., copper) in the conductive pattern 21 of the third redistribution pattern 310 from being diffused. Since the second metal pattern 612 is formed of or includes gold, it may be used as a wetting layer.

In an embodiment, since the first bonding pad 610 is in contact with the third interconnection portion L3 of the third redistribution pattern 310 without any via interposed therebetween, it may be possible to reduce a length of an electrical path from the first semiconductor chip 700 to an outer coupling terminal 908, in the structure of FIG. 1.

In the third redistribution pattern 310, the top surface LV1 of the third interconnection portion L3 may be partially recessed at a region overlapped with the third via portion V3. The lowermost portion of the partially recessed region of the top surface LV1 of the third interconnection portion L3, which is vertically overlapped with the third via portion V3, may be positioned at a lower level than the other portion of the top surface LV1 of the third interconnection portion L3 or the first surface SF1 of the first bonding pad 610. In the first and second redistribution patterns 110 and 210, the interconnection portions L1 and L2, which are vertically overlapped with the via portions V1 and V2, may also have partially-recessed top surfaces.

A sum T1 of thicknesses of the third via portion V3 and the third interconnection portion L3, which are vertically overlapped with each other, may be larger than a thickness T2 of the first bonding pad 610.

The third insulating layer 320 may be provided to cover edge portions of the top surfaces of the third interconnection portion L3 and edge portions of the first bonding pad 610. A portion of the third insulating layer 320 overlapped with the first bonding pad 610 may protrude upward relative to the other portion of the third insulating layer 320.

In the present specification, a solder mask material (e.g., an epoxy material used for a conventional PCB substrate) may be absent in the third insulating layer 320. In the case of the conventional PCB substrate, a solder mask material may be used to cover the entire portion of the interconnection structure, other than a pad portion. Also, a prepreg material, in which an epoxy compound impregnated with glass fibers is included, may be used as an insulating layer covering an inner interconnection layer. This means that the solder mask material covering the entire portion of the interconnection structure other than the pad portion is different from the prepreg material covering the inner interconnection layer. By contrast, according to an embodiment of the inventive concept, the third insulating layer 320 may be formed of or include substantially the same material as the first insulating layer 120 and the second insulating layer 220.

Figure 2B:
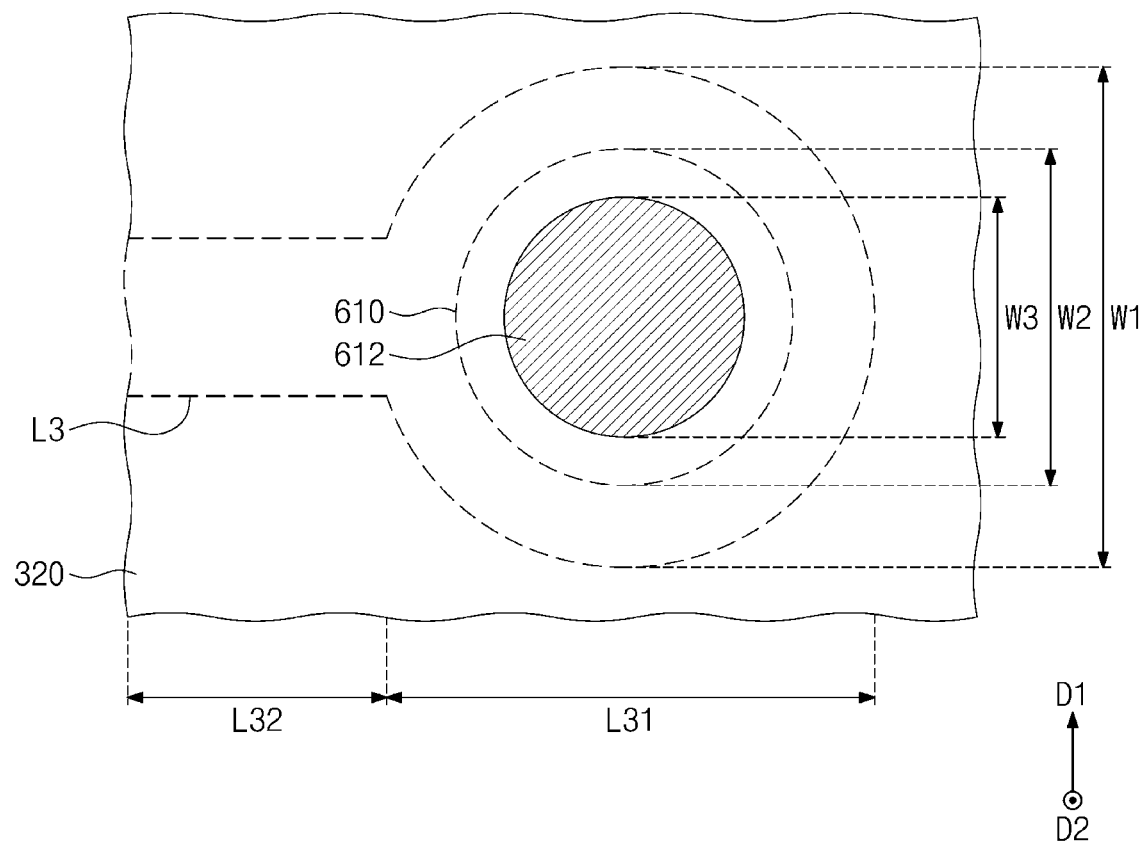
FIG. 2B is a plan view schematically illustrating a planar shape of the portion 'aa' of FIG. 1.

FIG. 2B is a plan view schematically illustrating the top surface of the third interconnection portion L3 of the third redistribution pattern 310, the first bonding pad 610, and the third insulating layer 320.

Referring to FIG. 2B, the third interconnection portion L3 of the third redistribution pattern 310 may include a first portion L31 and a second portion L32. The first portion L31 may be wider than the second portion L32 and may be vertically overlapped with the first bonding pad 610. The first portion L31 may have a first width W1 in the first direction D1. The first bonding pad 610 may have a second width W2 in the first direction D1. The second width W2 may be smaller than the first width W1.

A third width W3 of the top surface of the first bonding pad 610 exposed through the third insulating layer 320 may be greater than half of the second width W2. For example, an area of the exposed top surface of the first bonding pad 610 may be greater than area of the top surface of the first bonding pad 610 covered with the third insulating layer 320.

Referring back to FIGS. 1 and 2A, the first semiconductor chip 700 may be provided on the lower redistribution substrate 1000. The first semiconductor chip 700 may be, for example, a logic chip. The first semiconductor chip 700 may be disposed on the lower redistribution substrate 1000 such that a first chip pad 705 of the first semiconductor chip 700 faces the lower redistribution substrate 1000.

The connection terminal 708 may be in contact with both of the first bonding pad 610 and the first chip pad 705 and may electrically connect the first chip pad 705 and the first bonding pad 610. The first semiconductor chip 700 may be electrically connected to the lower redistribution substrate 1000 through the connection terminal 708. The connection terminal 708 may include at least one of solder, pillar, and bump. The connection terminal 708 may be formed of or include at least one of conductive materials (e.g., tin (Sn) and silver (Ag)).

The top surface of the first bonding pad 610 exposed through the third insulating layer 320 may be in contact with the connection terminal 708. An under-fill pattern 710 may be provided in a gap region between the third insulating layer 320 and the first semiconductor chip 700. The under-fill pattern 710 may be spaced apart from the first bonding pad 610, with the third insulating layer 320 interposed therebetween. In other words, the first bonding pad 610 may not be in contact with the under-fill pattern 710.

A conductive pillar 930 may be provided on the lower redistribution substrate 1000 and in the first molding member 950. The conductive pillar 930 may be laterally spaced apart from the first semiconductor chip 700. The conductive pillar 930 may be in contact with the top surface of the third interconnection portion L3 of at least one of the third redistribution patterns 310. The conductive pillar 930 may include a via portion that is in contact with the top surface of the third interconnection portion L3.

The conductive pillar 930 may be electrically connected to the outer coupling terminal 908 or the first semiconductor chip 700 through the redistribution patterns 110, 120, and 130. The conductive pillar 930 may be formed of or include, for example, copper. A height of the conductive pillar 930 from the top surface of the third insulating layer 320 may be, for example, about 200 μm.

The first molding member 950 may be formed on the lower redistribution substrate 1000 to cover the lower redistribution substrate 1000. The first molding member 950 may cover the top surface of the third insulating layer 320 and a side surface of the under-fill pattern 710. The first molding member 950 may cover a side surface of the conductive pillar 930, but not the top surface of the conductive pillar 930. The first molding member 950 may also cover top and side surfaces of the first semiconductor chip 700.

The outer coupling terminals 908 may be disposed on the second surface 1000b of the lower redistribution substrate 1000 and the first protection layer 20. Each of the outer coupling terminals 908 may be vertically overlapped with a respective under-bump pattern 10. Additionally, each of the outer coupling terminals 908 may be in contact with the respective under-bump pattern 10. The outer coupling terminal 908 may be coupled to the first chip pad 705 through the under-bump pattern 10 and the redistribution patterns 110, 210, and 310. Thus, it may be unnecessary to align the outer coupling terminal 908 to the first chip pad 705 in a vertical direction. In an embodiment, a plurality of the outer coupling terminals 908 may be provided, and in this case, at least one of the outer coupling terminal 908 may not be vertically overlapped with the first semiconductor chip 700. This may make it possible to increase a degree of freedom in the arrangement of the outer coupling terminal 908. The semiconductor package 1 may be a fan-out semiconductor package fabricated by a chip-last process.

The upper redistribution substrate 2000 may be disposed on a top surface of the first molding member 950 and a top surface of the conductive pillar 930.

The upper redistribution substrate 2000 may include a second protection layer 30, a fourth redistribution layer 400, and a fifth redistribution layer 500. The upper redistribution substrate 2000 is illustrated to include two redistribution layers 400 and 500, but the inventive concept is not limited to this example. For example, the upper redistribution substrate 2000 may further include at least one additional redistribution layer, or one of the redistribution layers may be omitted.

A thickness H2 of the upper redistribution substrate 2000 may range from about 10 to 60 μm.

The fourth redistribution layer 400 may be substantially the same as the first redistribution layer 100 or the second redistribution layer 200 described above. The fifth redistribution layer 500 may be substantially the same as the third redistribution layer 300 described above.

The fourth redistribution layer 400 may include fourth redistribution patterns 410 and a fourth insulating layer 420. The fifth redistribution layer 500 may include fifth redistribution patterns 510 and a fifth insulating layer 520. The fifth redistribution layer 500 may be the topmost layer of the redistribution layers. For example, the fifth redistribution layer 500 may be the redistribution layer, of the redistribution layers 400 and 500, that is disposed farthest from the first surface 1000a of the lower redistribution substrate 1000.

Each of the fourth redistribution patterns 410 may include a fourth via portion V4 and a fourth interconnection portion L4, which are connected to each other to form a single object. The fourth via portion V4 may fill a fourth via hole VH4 in the second protection layer 30 and may be in contact with the top surface of the conductive pillar 930. The fourth interconnection portion L4 may be provided on a top surface of the second protection layer and the fourth via portion V4 and may be connected to the fourth via portion V4.

Each of the fifth redistribution patterns 510 may include a fifth via portion V5 and a fifth interconnection portion L5, which are connected to each other to form a single object. The fifth via portion V5 may fill a fifth via hole VH5 in the fourth insulating layer 420 and may be in contact with a top surface of the fourth interconnection portion L4 of the fourth redistribution pattern 410. The fifth interconnection portion L5 may be provided on a top surface of the fourth insulating layer 420 and the fifth via portion V5 and may be connected to the fifth via portion V5.

The second protection layer 30, and the fourth and fifth insulating layers 420, and 520 may include at least one of photo-sensitive polyimide, poly(benzoxazole), phenol-based polymers, or benzocyclobutene-based polymers. In an embodiment, there may be no measurable interface between the second protection layer 30 and the fourth insulating layer 420 and between the fourth insulating layer 420 and the fifth insulating layer 520. In other words, the second protection layer 30, the fourth insulating layer 420, and the fifth insulating layer 520 may be inspected as a single insulating layer.

A second bonding pad 620 may be provided on the fifth interconnection portion L5 of the fifth redistribution pattern 510. In an embodiment, the shape of the topmost surface of the upper redistribution substrate 2000 may be substantially the same or similar to that of the lower redistribution substrate 1000.

The fifth redistribution pattern 510, the fifth insulating layer 520, and the second bonding pad 620 may correspond to the third redistribution pattern 310, the third insulating layer 320, and the first bonding pad 610, respectively. The shape of each of the fifth redistribution pattern 510, the fifth insulating layer 520, and the second bonding pad 620 may be substantially the same as or similar to that of a corresponding one of the third redistribution pattern 310, the third insulating layer 320, and the first bonding pad 610, respectively, as described with reference to FIGS. 2A and 2B.

The second bonding pad 620 may include a third metal pattern 621 and a fourth metal pattern 622. The third metal pattern 621 may be formed of or include nickel (Ni), and the fourth metal pattern 622 may be formed of or include gold (Au). The third metal pattern 621 may be in contact with the fifth interconnection portion L5 of the fifth redistribution pattern 510, without any via interposed therebetween. The fourth metal pattern 622 may be in contact with a package coupling terminal 808, which will be described below. The fifth insulating layer 520 may be provided to cover an edge portion of a top surface of the second bonding pad 620 and to not cover a center portion of the second bonding pad 620.

The second semiconductor package PK2 may be provided on the upper redistribution substrate 2000. The second semiconductor package PK2 may include a package substrate 810, a second semiconductor chip 800, and a second molding member 850. The package substrate 810 may be a printed circuit board or a redistribution substrate. Metal pads 815 and 817 may be provided on opposite surfaces of the package substrate 810.

In an embodiment, the second semiconductor chip 800 may be a memory chip, such as a DRAM chip or a NAND FLASH memory chip. The second semiconductor chip 800 may be of a different kind from that of the first semiconductor chip 700. A second chip pad 805 may be provided on a surface of the second semiconductor chip 800 and may be connected to the metal pad 815 of the package substrate 810 in a wire bonding manner.

The package coupling terminal 808 may be disposed between the first semiconductor package PK1 and the second semiconductor package PK2. The package coupling terminal 808 may be in contact with the second bonding pad 620 and the metal pad 817. A lower portion of the package coupling terminal 808 may be enclosed by a protruding portion of the fifth insulating layer 520.

The package coupling terminal 808 may be electrically connected to the second bonding pad 620 and the metal pad 817. Thus, the second semiconductor package PK2 may be electrically connected to the first semiconductor chip 700 and the outer coupling terminal 908 through the upper redistribution substrate 2000, the package coupling terminal 808, and the conductive pillar 930.

FIGS. 3A to 3J are sectional views illustrating a process of fabricating a semiconductor package, according to an embodiment of the inventive concept. For concise description, an element previously described with reference to FIG. 1 may be identified by the same reference number without repeating an overlapping description thereof.

Figure 3A:
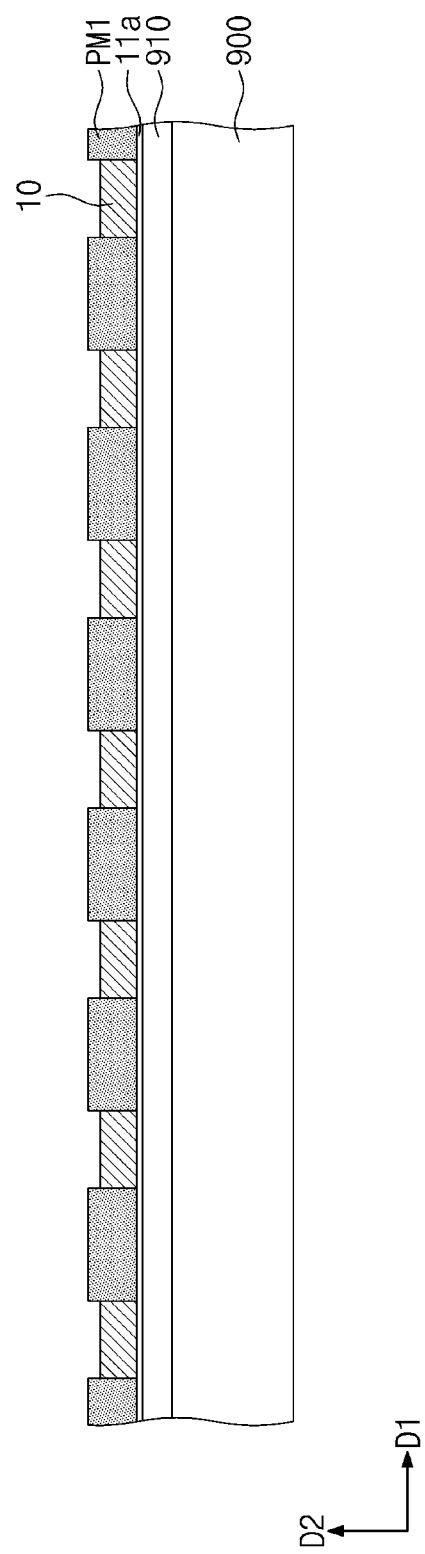
FIGS. 3A to 3J are sectional views illustrating a process of fabricating a semiconductor package, according to an embodiment of the inventive concept.

Referring to FIG. 3A, a carrier substrate 900 covered with an adhesive layer 910 may be provided. A first seed layer 11a may be formed on the carrier substrate 900 to cover a top surface of the adhesive layer 910. The first seed layer 11a may be formed by a deposition process. The adhesive layer 910 may attach the first seed layer 11a to the carrier substrate 900.

A first photomask pattern PM1 may be formed on a top surface of the first seed layer 11a. The first photomask pattern PM1 may include an opening, which defines a space for the under-bump pattern 10. The first photomask pattern PM1 may be formed by forming, exposing, and developing a photoresist layer. The first photomask pattern PM1 may be formed to expose the first seed layer 11a. The under-bump pattern 10 may be formed in the opening by an electroplating process, in which the first seed layer 11a is used as an electrode.

Figure 3B:
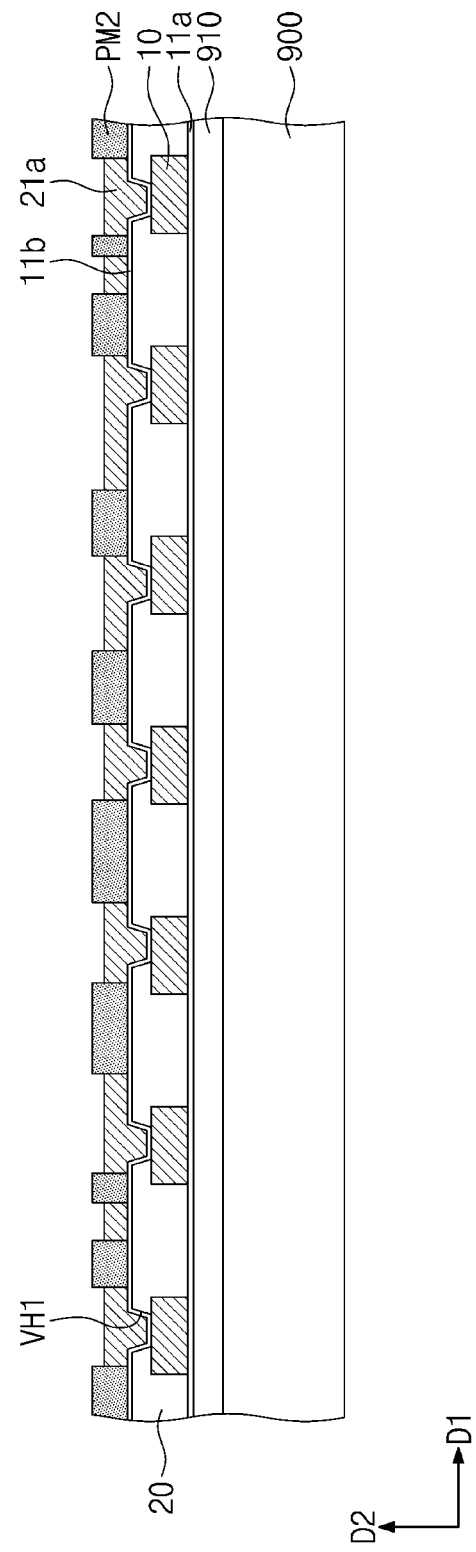

Referring to FIG. 3B, the first photomask pattern PM1 may be removed. Thereafter, the first protection layer 20 may be formed to cover the under-bump pattern 10. The first protection layer 20 may be formed by a coating process (e.g., a spin coating process or a slit coating process). The first protection layer 20 may be patterned by an exposure and developing process to have the first via hole VH1 defining the via portion V1 of the first redistribution pattern 110. The first via hole VH1 may expose the top surface of the under-bump pattern 10. A curing process may be performed on the first protection layer 20. A second seed/barrier layer 11b may be formed to cover the top surface of the first protection layer 20. A second photomask pattern PM2 may be formed on the second seed/barrier layer 11b. The second photomask pattern PM2 may define a region, in which the first interconnection portion L1 of the first redistribution pattern 110 will be formed by a subsequent process. Thereafter, the first conductive pattern 21a may be formed on the second seed/barrier layer 11b by an electroplating method.

Figure 3C:
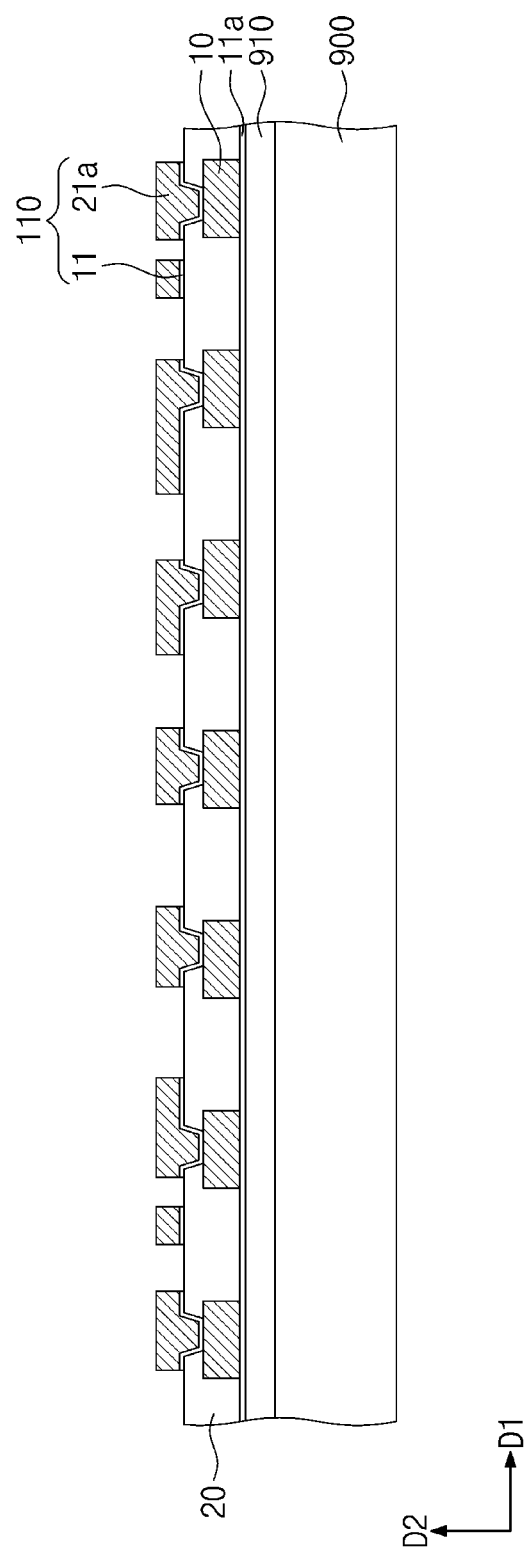

Referring to FIG. 3C, the second photomask pattern PM2 may be removed. Thereafter, the second seed/barrier layer 11b may be etched to form the seed/barrier pattern 11. As a result, the first redistribution pattern 110 including the first conductive pattern 21a and the seed/barrier pattern 11 may be formed. The entire portion of the second seed/barrier layer 11b, except portions vertically overlapped with the first conductive patterns 21a, may be removed by the etching process. The etching process may be, for example, a wet etching process.

Figure 3D:
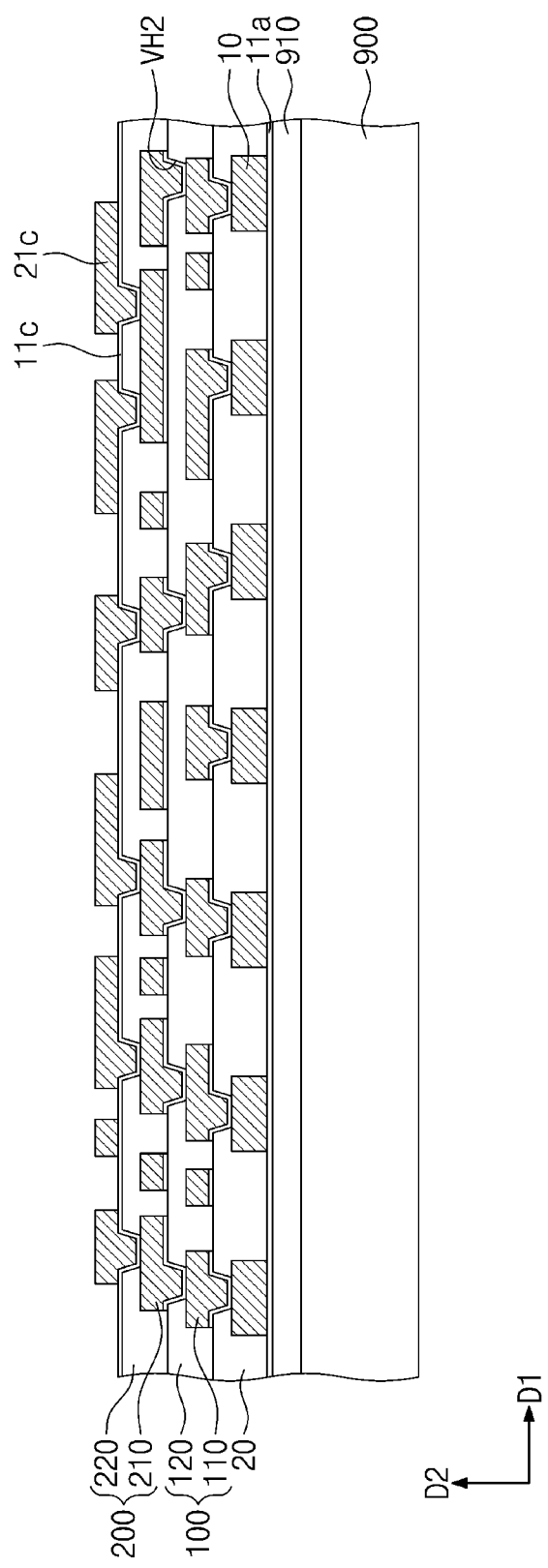

Referring to FIG. 3D, the first insulating layer 120 may be formed to cover the first redistribution pattern 110 and the first protection layer 20. The first insulating layer 120 may be formed by a coating process (e.g., a spin coating process or a slit coating process). The first insulating layer 120 may be patterned by an exposure and developing process to have the second via hole VH2 defining the second via portion V2 of the second redistribution pattern 210 to be described below. The second via hole VH2 may expose a portion of the top surface of the first interconnection portion L1 of the first redistribution pattern 110. A curing process may be performed on the first insulating layer 120. As a result, the first redistribution layer 100 including the first redistribution pattern 110 and the first insulating layer 120 may be formed.

Thereafter, the second redistribution pattern 210 may be formed. The second redistribution pattern 210 may be formed by substantially the same method as that for the first redistribution pattern 110. The second insulating layer 220 may be formed to cover the second redistribution pattern 210 and may be cured. The second insulating layer 220 may be formed by substantially the same method as that for the first insulating layer 120. As a result, the second redistribution layer 200 including the second redistribution pattern 210 and the second insulating layer 220 may be formed.

A third seed/barrier layer 11c and a third conductive pattern 21c may be formed on the second redistribution layer 200.

Figure 3E:
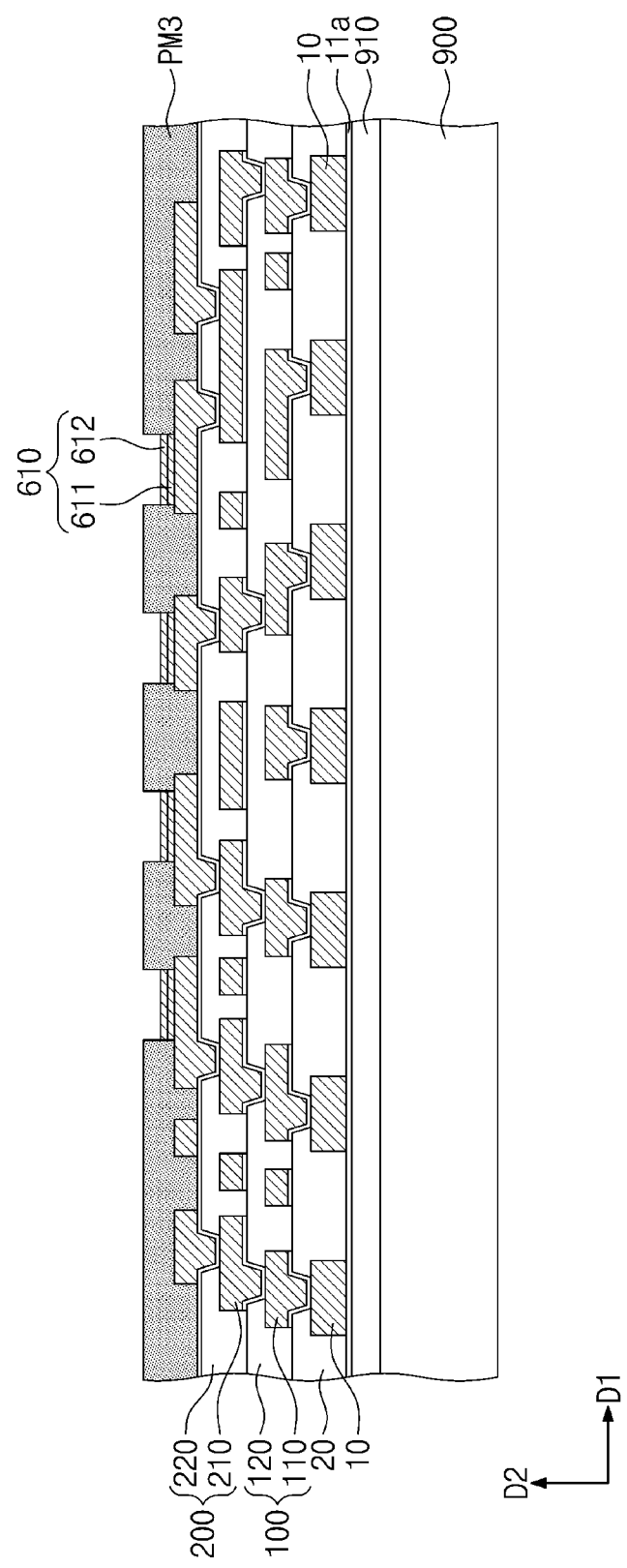

Referring to FIG. 3E, a third photomask pattern PM3 may be formed on the third conductive pattern 21c and the third seed/barrier layer 11c. The third photomask pattern PM3 may be formed so that a portion of the top surface of the third interconnection portion L3 of the third redistribution pattern 310 is exposed, as described below. The third photomask pattern PM3 may include openings defining regions, in which the first bonding pads 610 will be formed.

The first metal pattern 611 and the second metal pattern 612 may be sequentially formed by an electroplating process. The first metal pattern 611 may be formed to be in contact with the top surface of the third interconnection portion L3 of the third redistribution pattern 310.

Figure 3F:
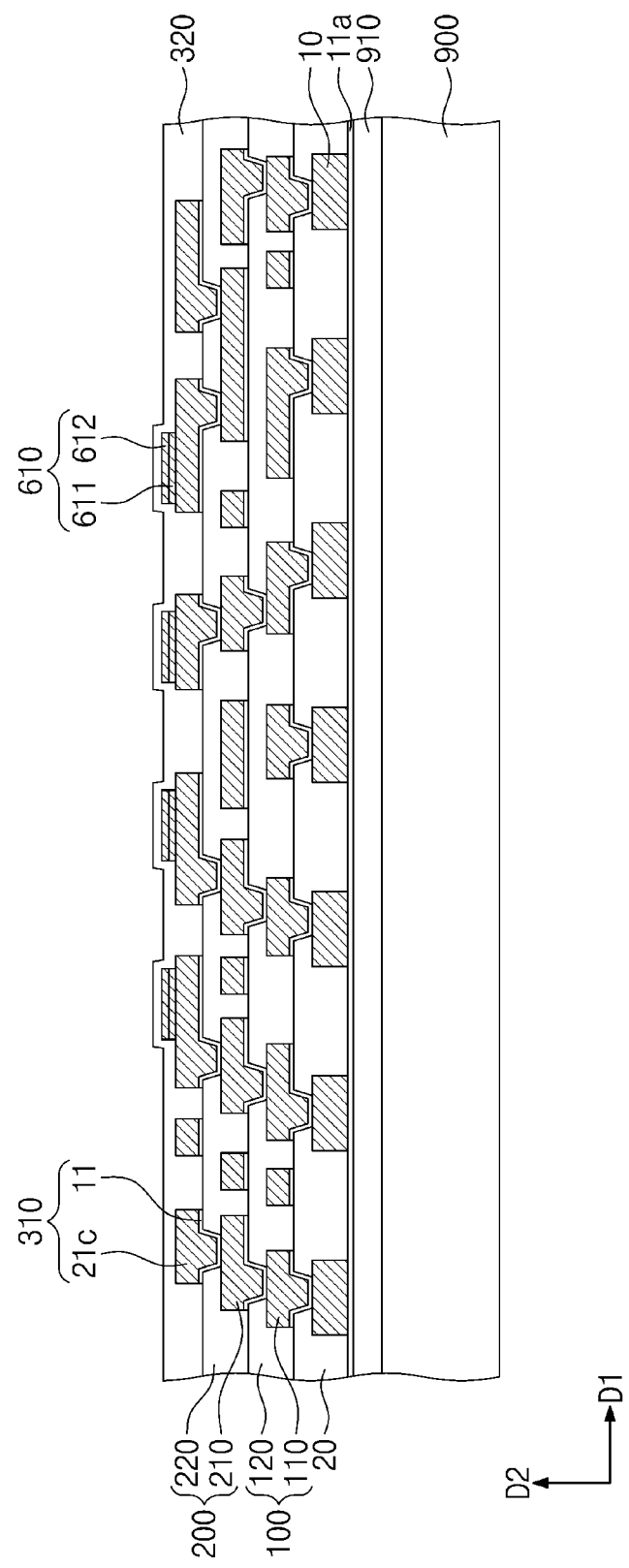

Referring to FIG. 3F, the third photomask pattern PM3 may be removed. Thereafter, the seed/barrier pattern 11 may be formed by performing an etching process on the third seed/barrier layer 11c. As a result, the third redistribution pattern 310 including the third conductive pattern 21c and the seed/barrier pattern 11 may be formed. The entire portion of the third seed/barrier layer 11c, except portions vertically overlapped with the third conductive patterns 21c, may be removed by the etching process. The third insulating layer 320 may be formed to cover the third redistribution pattern 310 and the first bonding pad 610. The third insulating layer 320 may be formed by substantially the same method as that for the first and second insulating layers 120 and 220.

As a result, the third redistribution layer 300 including the third redistribution pattern 310 and the third insulating layer 320 may be formed. Furthermore, the lower redistribution substrate 1000 including the first protection layer 20 and the first to third redistribution layers 100, 200, and 300 may be formed.

Figure 3G:
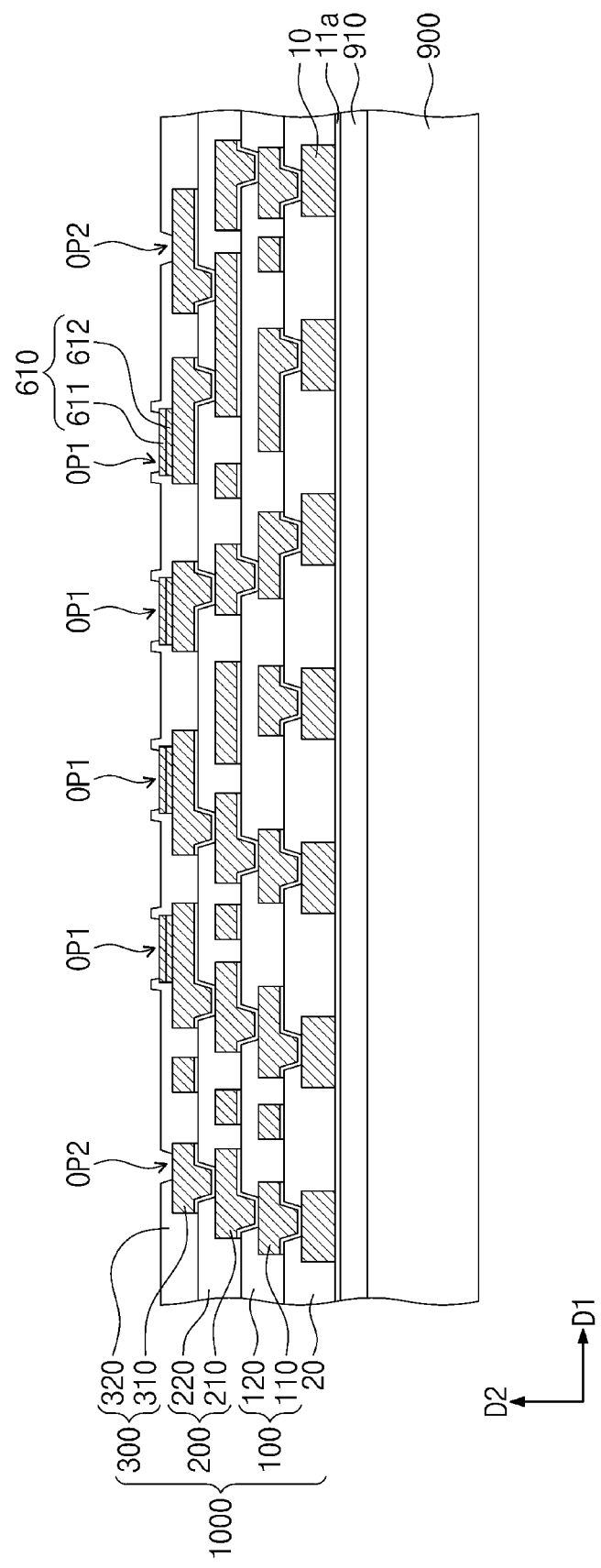

Referring to FIG. 3G, a patterning process may be performed to expose a portion of the top surface of the first bonding pad 610 and a portion of the top surface of the interconnection portion L3 of the third redistribution pattern 310. The patterning process may include performing an exposure and developing process on the third insulating layer 320. As a result of the patterning process, first openings OP1 may be formed to expose portions of the top surface of the first bonding pad 610, and second openings OP2 may be formed to expose portions of the top surface of the third interconnection portion L3 of the third redistribution pattern 310. A via portion of the conductive pillar 930 may be formed in the second opening OP2 by a process to be described below.

According to a conventional process, the third insulating layer 320 may be formed immediately after the formation of the third redistribution pattern 310, and an exposure and developing may be performed to form a via hole exposing the third interconnection portion L3 of the third redistribution pattern 310. Thereafter, a via may be formed on the third insulating layer 320 to fill the via hole, and the bonding pad 610 may be formed on the via.

As previously described with reference to FIG. 2A, the top surface LV1 of the third interconnection portion L3 of the third redistribution pattern 310 vertically overlapped with the third via portion V3 may have a recessed portion, which is positioned at a level lower than the other portion of the top surface of the third interconnection portion L3.

According to the conventional process, in the case where a via hole is formed on the third interconnection portion L3 positioned at a low level, a failure may occur in which the third interconnection portion L3 is not exposed during the formation of the via hole, due to a relatively large thickness of the third insulating layer 320. In this case, even when a via is formed in the via hole, the via may not be electrically connected to the third interconnection portion L3. Especially, this failure may easily occur during a process of exposing the uppermost insulating layer, in a structure (e.g., a stack via structure), in which vias and interconnection lines are vertically overlapped with each other.

By contrast, according to an embodiment of the inventive concept, the above failure may be reduced, because the first bonding pad 610 is directly formed on the uppermost redistribution pattern 310.

Figure 3H:
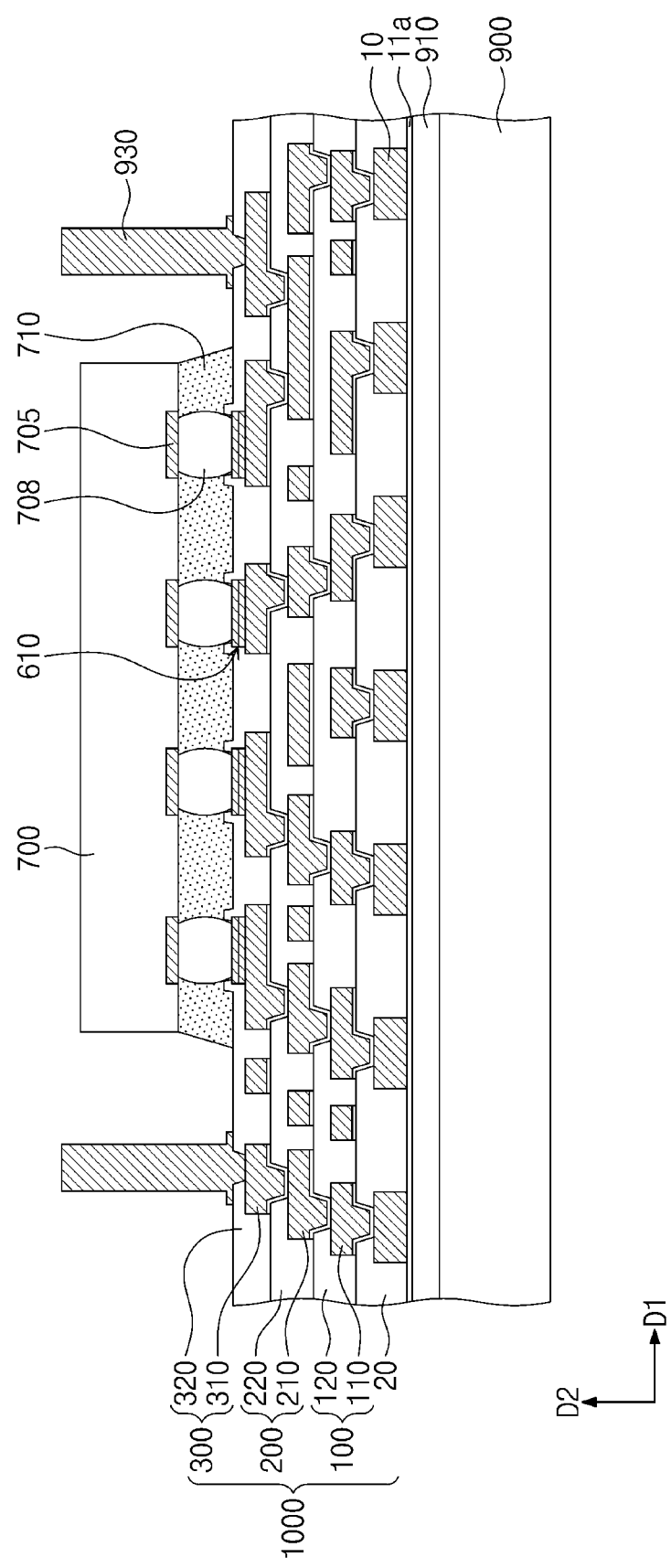

Referring to FIG. 3H, the conductive pillar 930 may be formed. The formation of the conductive pillar 930 may include forming a photoresist pattern (not shown) to define a gap region, in which the conductive pillar 930 will be formed, filling the gap region with a conductive material, and removing the photoresist pattern.

Next, the first semiconductor chip 700 may be disposed on the lower redistribution substrate 1000 such that the first chip pad 705 of the first semiconductor chip 700 faces the lower redistribution substrate 1000. The disposing of the first semiconductor chip 700 on the lower redistribution substrate 1000 may be performed by a thermo-compression process.

The connection terminal 708 may be attached to the top surface of the first bonding pad 610, which is exposed through the first opening OP1 of the third insulating layer 320. Since the third insulating layer 320 has a dam-shaped top surface surrounding the first bonding pad 610, the third insulating layer 320 may prevent a conductive material, which is supplied to form the connection terminal 708, from flowing toward other connection terminals 708 during a thermocompression process. In addition, due to the aforedescribed structure of the third insulating layer 320, the first bonding pad 610 and the connection terminal 708 may be in good contact with each other in a self-aligned manner or without a misalignment issue. Since the third insulating layer 320 serves as the dam or the overflow-preventing structure, the connection terminal 708 may be in contact with the entire region of the top surface of the first bonding pad 610 that is exposed through the third insulating layer 320.

The under-fill pattern 710 may be formed to fill an empty region between the first semiconductor chip 700 and the lower redistribution substrate 1000.

The under-fill pattern 710 may be provided to prevent stress and deformation issues, which are caused by a difference in thermal expansion coefficient between the lower redistribution substrate 1000 and the first semiconductor chip 700. In a conventional process, the first bonding pad 610 may be exposed to the outside, on the top surface of the third insulating layer 320, and thus, the side surface of the first bonding pad 610 may be in contact with the under-fill pattern 710. In this case, a stress may be produced by a difference in thermal expansion coefficient between the first bonding pad 610 and the under-fill pattern 710 and may be exerted on the third insulating layer 320 adjacent thereto. Since the third insulating layer 320 has a relatively low strength, a crack may be easily formed in the third insulating layer 320. Furthermore, there may be a crack-propagation issue, in which the crack is propagated from the third insulating layer 320 toward the first protection layer 20.

According to an embodiment of the inventive concept, since a portion of the first bonding pad 610 is enclosed by the third insulating layer 320 and the other portion is in contact with the connection terminal 708, the first bonding pad 610 may be spaced apart from the under-fill pattern 710. Accordingly, the first bonding pad 610 does not contact the under-fill pattern 710. Thus, it is possible to reduce a crack issue, which may occur when the under-fill pattern 710 is in contact with the first bonding pad 610.

Figure 3I:
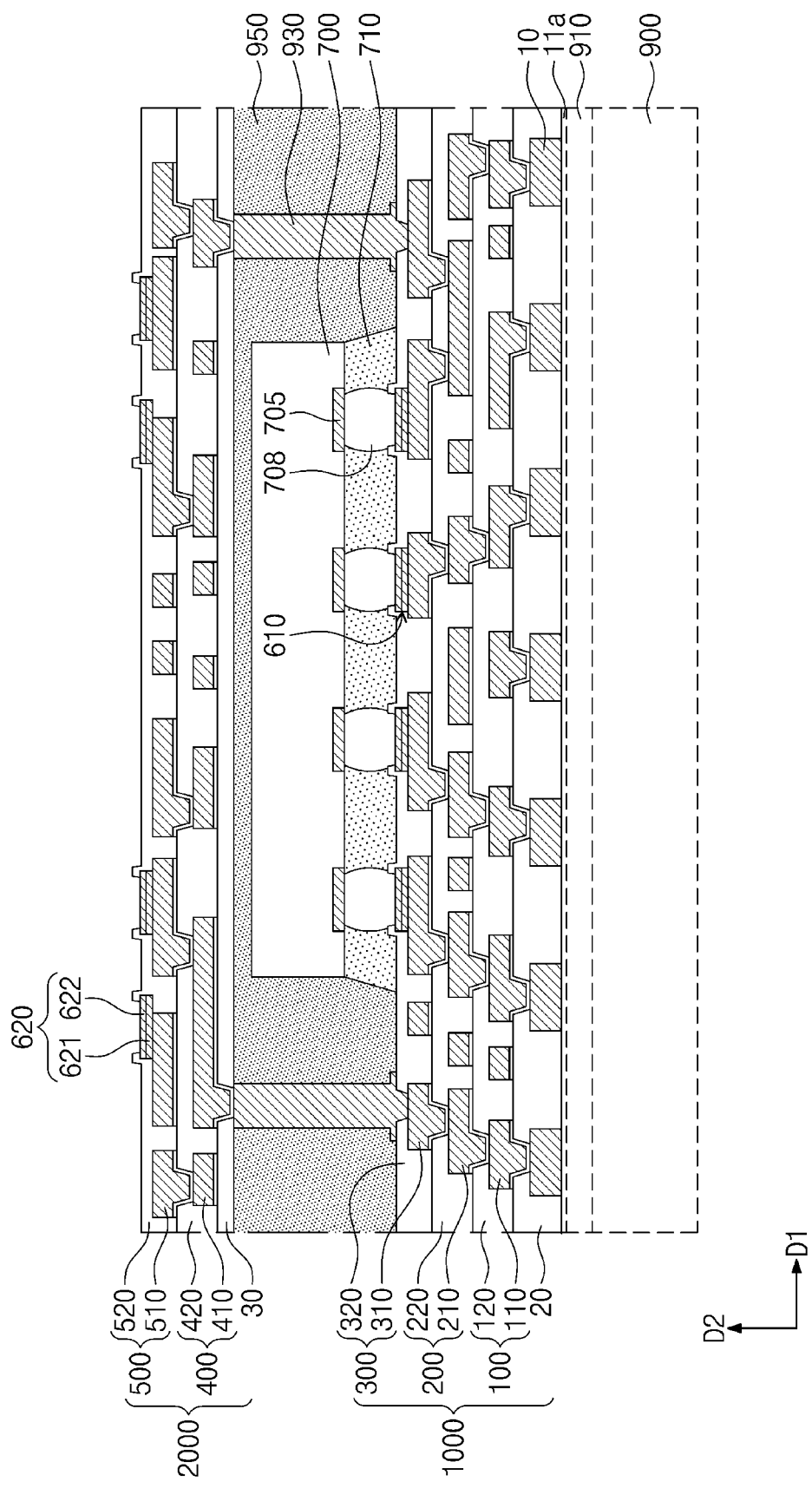

Referring to FIG. 3I, a first molding member 950 may be formed to cover the top surface of the lower redistribution substrate 1000, the first semiconductor chip 700, and the conductive pillar 930. The upper redistribution substrate 2000 may be formed on the first molding member 950.

The formation of the upper redistribution substrate 2000 may include forming the fourth redistribution layer 400, forming the fifth redistribution layer 500, and forming the second bonding pad 620. The fourth redistribution layer 400 may be formed by substantially the same method as that for the first or second redistribution layer 100 or 200 described above. The fifth redistribution layer 500 may be formed by substantially the same method as that for the third redistribution layer 300 described above. The second bonding pad 620 may be formed by substantially the same method as that for the first bonding pad 610 described above.

A singulation process may be performed along a dash-dot line which is drawn from the upper redistribution substrate 2000 to the lower redistribution substrate 1000. Thereafter, the carrier substrate 900, the adhesive layer 910, and the first seed layer 11a may be removed. The removal of the first seed layer 11a may be achieved by an etching process. As a result of the removal of the first seed layer 11a, the under-bump patterns 10 may be exposed to the outside.

Figure 3J:
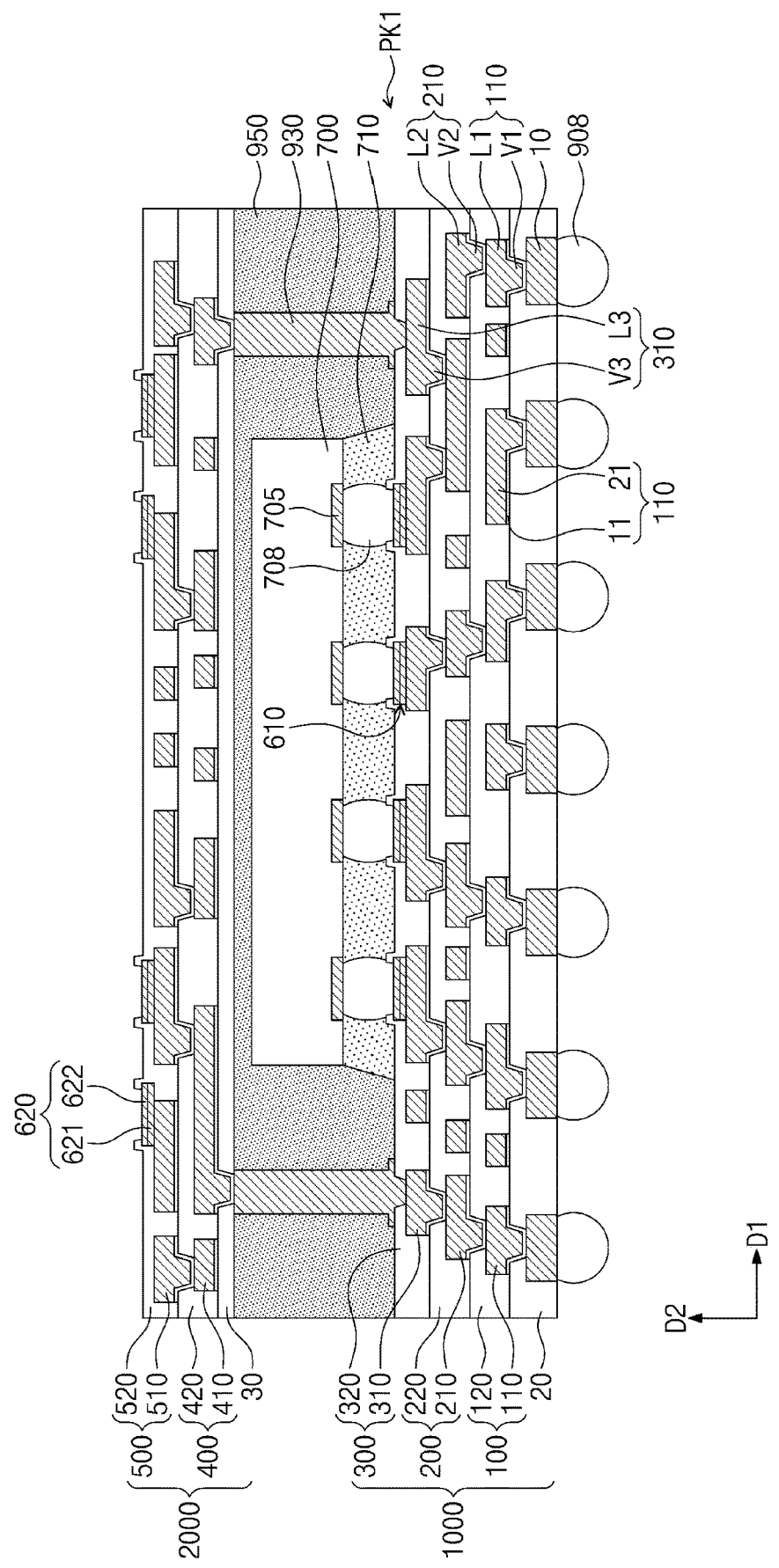

Referring to FIG. 3J, the first semiconductor package PK1 may be manufactured by forming the outer coupling terminals 908 on the exposed under-bump patterns 10. Referring back to FIG. 1, the second semiconductor package PK2 may be mounted on the first semiconductor package PK1.

Figure 4:
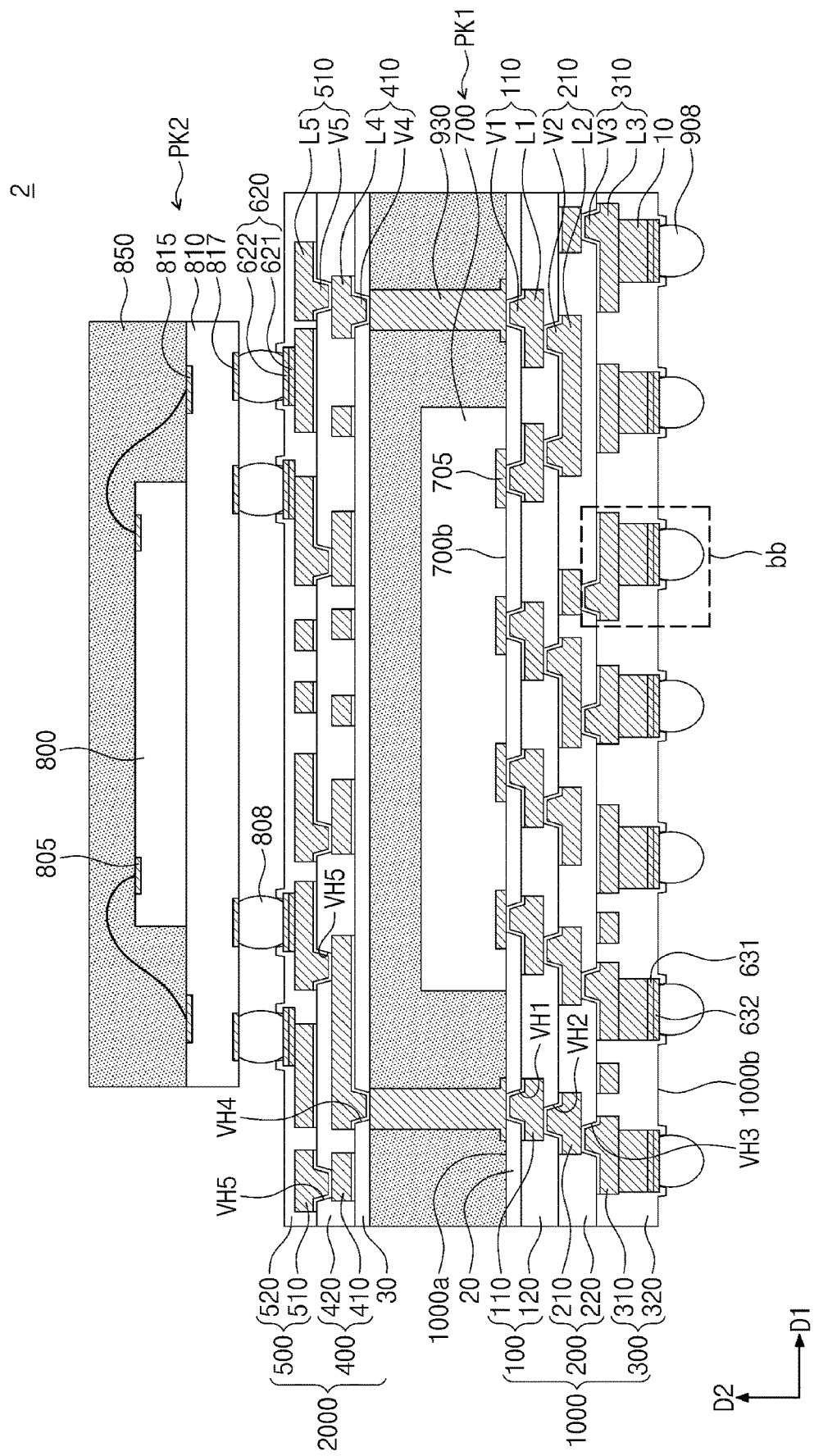
FIG. 4 is a sectional view illustrating a semiconductor package according to an embodiment of the inventive concept.
Figure 5:
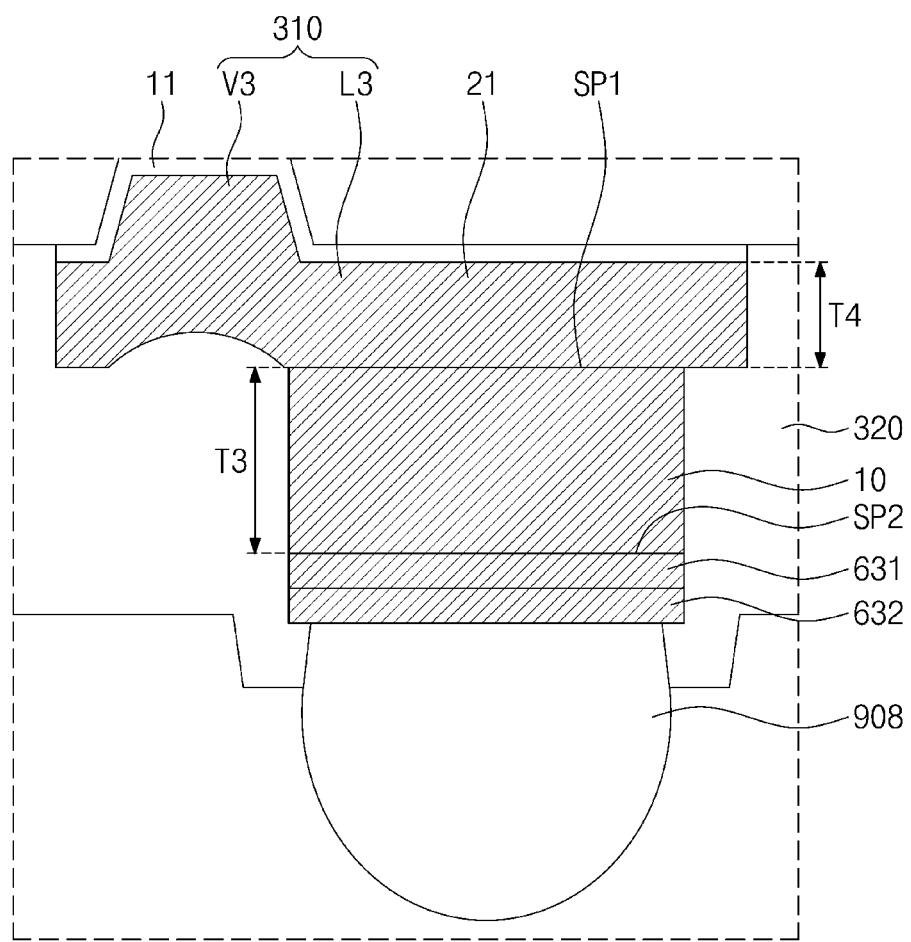
FIG. 5 is an enlarged sectional view of a portion 'bb' of FIG. 4.

FIG. 4 is a sectional view illustrating a semiconductor package 2 according to an embodiment of the inventive concept. FIG. 5 is an enlarged sectional view of a portion 'bb' of FIG. 4. For concise description, an element previously described with reference to FIG. 1 may be identified by the same reference number without repeating an overlapping description thereof. The semiconductor package 2 may be a fan-out semiconductor package fabricated by a chip-first process.

Referring to FIG. 4, the first semiconductor chip 700 and the lower redistribution substrate 1000 may be electrically connected to each other, without the connection terminal 708 of FIG. 1. The lower redistribution substrate 1000 may include a first protection layer 20, a first redistribution layer 100, a second redistribution layer 200, and a third redistribution layer 300, which are sequentially stacked on a surface 700b of the first semiconductor chip 700.

The first redistribution patterns 110 may be the topmost redistribution patterns of the redistribution patterns 110, 210, and 310. The first redistribution patterns 110 may be a redistribution pattern that is disposed closest to the first surface 1000a of the lower redistribution substrate 1000.

The third redistribution patterns 310 may be the bottommost redistribution patterns of the redistribution patterns 110, 210, and 310. The third redistribution patterns 310 may be redistribution patterns that are disposed closest to the second surface 1000b of the lower redistribution substrate 1000.

The first protection layer 20 may include first via holes VH1 exposing the first chip pad 705 and a pad portion below the conductive pillar 930. The first redistribution patterns 110 may be provided on the first protection layer 20 to fill the first via holes VH1. Some of the first via portions V1 of the first redistribution patterns 110 may be in contact with the first chip pads 705, and the others may be in contact with the pad portion below the conductive pillar 930. Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

The under-bump patterns 10 may be provided on the third interconnection portions L3 of some of the third redistribution patterns 310.

Referring to FIG. 5, the under-bump pattern 10 may have a first surface SP1 and a second surface SP2, which are opposite to each other. The first surface SP1 of the under-bump pattern 10 and a top surface of the third interconnection portion L3 may be in contact with each other, without any via interposed therebetween. A thickness T3 of the under-bump pattern 10 may be larger than the largest thickness T4 of the third interconnection portion L3. The under-bump pattern 10 may be formed of or include copper (Cu), and any seed/barrier pattern may not be interposed between the first surface SP1 of the under-bump pattern 10 and the top surface of the third interconnection portion L3. The conductive pattern 21 may be formed of or include copper. In an embodiment, there may be no measurable interface between the under-bump pattern 10 and the third interconnection portion L3.

In an embodiment, since the under-bump pattern 10 is in contact with the third interconnection portion L3 of the third redistribution pattern 310, without any via interposed therebetween, it may be possible to reduce a length of an electrical path from the first semiconductor chip 700 to the outer coupling terminal 908.

A first lower under-bump pattern 631 and a second lower under-bump pattern 632 may be sequentially provided on the second surface SP2 of the under-bump pattern 10. The first and second lower under-bump patterns 631 and 632 may be formed of or include a material different from that of the under-bump pattern 10. The first lower under-bump pattern 631 may be formed of or include nickel and may be used as a barrier layer preventing diffusion of a material (e.g., copper) in the under-bump pattern 10. The second lower under-bump pattern 632 may be formed of or include gold and may be used as a wetting layer. Side surfaces of the first and second lower under-bump patterns 631 and 632 may be enclosed by the third insulating layer 320.

The third insulating layer 320 may be provided to cover an edge portion of a top surface of the second lower under-bump pattern 632 and to not cover a center portion of the top surface of the second lower under-bump pattern 632. A portion of the third insulating layer 320 overlapped with the under-bump pattern 10 may protrude relative to other portions of the third insulating layer 320. The outer coupling terminal 908 may be in contact with a top surface of the second lower under-bump pattern 632 that is not covered with the third insulating layer 320.

In an embodiment, the first and second lower under-bump patterns 631 and 632 may be omitted. In this case, the third insulating layer 320 may be provided to cover an edge portion of the second surface SP2 of the under-bump pattern 10 and to not cover a center portion of the second surface SP2 of the under-bump pattern 10. The outer coupling terminal 908 may be in contact with the exposed second surface SP2 of the under-bump pattern 10.

The second semiconductor package PK2 may be configured to have substantially the same structure as the second semiconductor package PK2 described with reference to FIG. 1. The second bonding pad 620, the fifth insulating layer 520, the fifth redistribution pattern 510, and the package coupling terminal 808 may also be configured to have substantially the same structure as those described with reference to FIG. 1.

Figure 6:
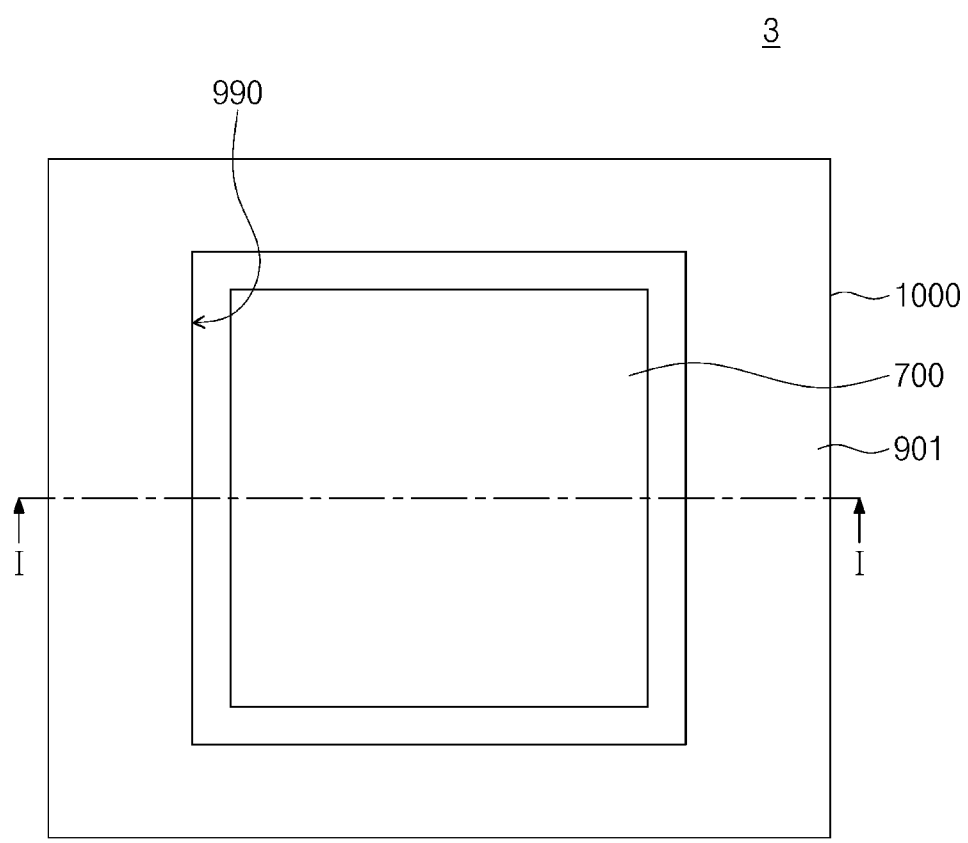
FIG. 6 is a plan view illustrating a semiconductor package according to an embodiment of the inventive concept.
Figure 7:
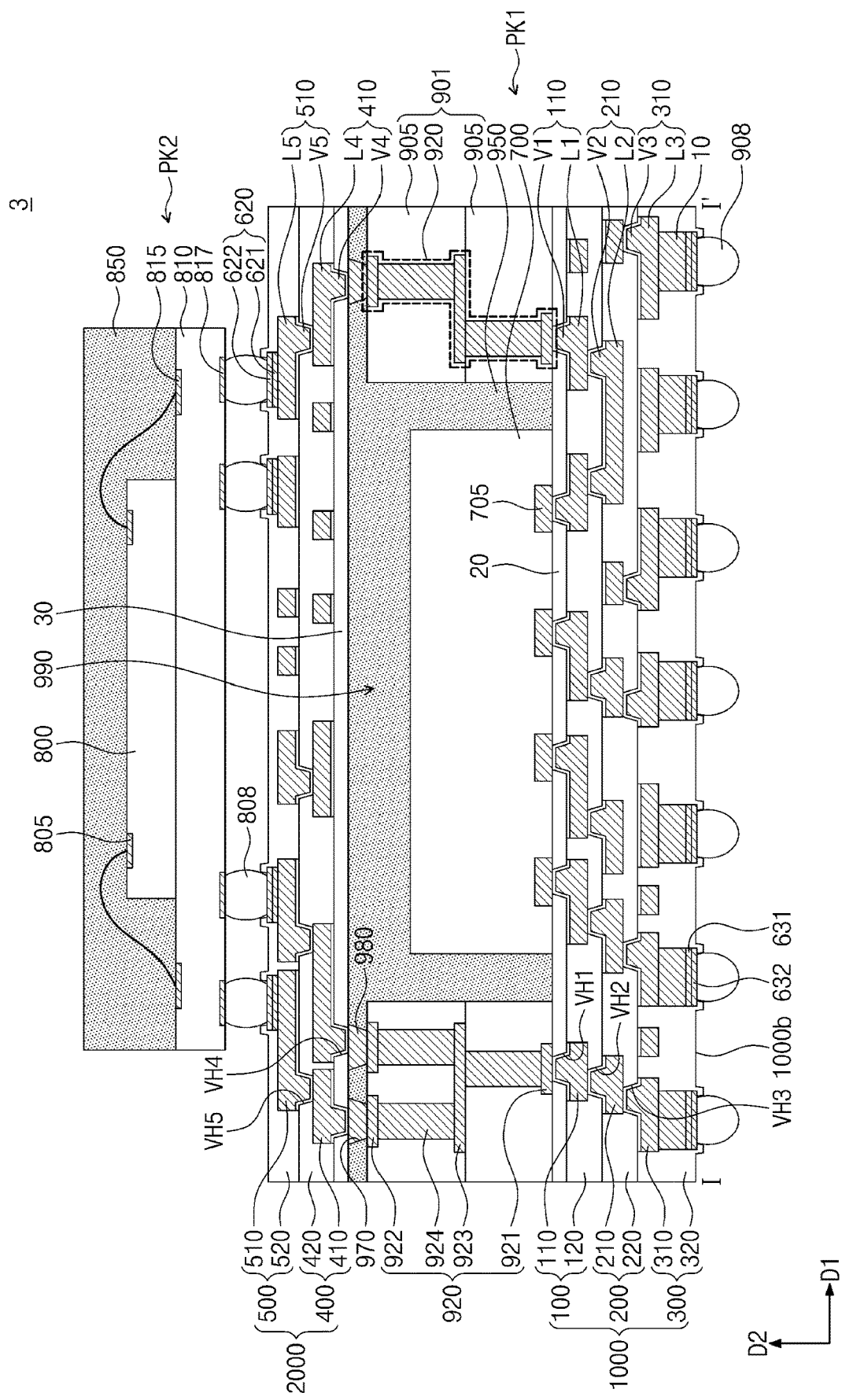
FIG. 7 is a sectional view taken along a line I-I' of FIG. 6.

FIG. 6 is a plan view illustrating a semiconductor package 3 according to an embodiment of the inventive concept. FIG. 7 is a sectional view taken along a line I-I' of FIG. 6. In order to reduce complexity in the drawings and to provide better understanding of this embodiment, some elements of the semiconductor package 3 may be omitted from FIG. 6. For concise description, an element previously described with reference to FIGS. 1 and 4 may be identified by the same reference number without repeating an overlapping description thereof. The semiconductor package 3 may be a fan-out semiconductor package fabricated by a chip-first process.

Referring to FIGS. 6 and 7, a semiconductor package 3 according to an embodiment of the inventive concept may include the first semiconductor package PK1 including a connection substrate 901. The connection substrate 901 may have a hole 990, which is provided to penetrate the same. When viewed in a plan view, the hole 990 may be located at a center portion of the lower redistribution substrate 1000. The first semiconductor chip 700 may be provided in the hole 990. The connection substrate 901 may be provided on the lower redistribution substrate 1000. As an example, the connection substrate 901 may be fabricated by forming the hole 990 in a printed circuit board. The connection substrate 901 may include base layers 905 and a conductive structure 920.

The base layers 905 may be formed of or include an insulating material. For example, the base layers 905 may be formed of or include at least one of carbon-containing materials, ceramics, or polymers. The base layers 905 may be formed of or include an insulating material different from those of the first protection layer 20, the first insulating layer 120, the second insulating layer 220, and the third insulating layer 320 of the lower redistribution substrate 1000.

The hole 990 may be provided to penetrate the base layers 905. The conductive structure 920 may include a first pad 921, a conductive line 923, vias 924, and a second pad 922.

The first pad 921 may be provided on a bottom surface of the connection substrate 901. The conductive line 923 may be interposed between the base layers 905. The vias 924 may be provided to penetrate the base layers 905 and may be coupled to the conductive line 923. The second pad 922 may be disposed on a top surface of the connection substrate 901 and may be coupled to one of the vias 924. The second pad 922 may be electrically connected to the first pad 921 through the vias 924 and the conductive line 923.

The second pad 922 may not be aligned with the first pad 921 in a vertical direction. The number or the arrangement of the second pads 922 may be different from those of the first pads 921. The conductive structure 920 may be formed of or include at least one of metallic materials. For example, the conductive structure 920 may be formed of or include at least one of copper, aluminum, gold, lead, stainless steel, iron, or alloys thereof.

The first molding member 950 may be provided to fill a region between the first semiconductor chip 700 and the connection substrate 901. An upper hole 970 may be provided on the first molding member 950 to expose the second pad 922 of the conductive structure 920.

In an embodiment, a conductive portion 980 may be provided in the upper hole 970 to fill the upper hole 970. In an embodiment, the conductive portion 980 may be formed of or include at least one of metals.

The lower redistribution substrate 1000 may be provided on a surface of the first molding member 950. The lower redistribution substrate 1000 may include the first protection layer 20, and the first protection layer 20 may include the first via holes VH1 exposing the first pad 921 of the conductive structure 920 and the first chip pad 705. The first redistribution pattern 110 may be provided on the first protection layer 20 to fill the first via hole VH1.

The upper redistribution substrate 2000 may be provided on the top surface of the first molding member 950. The upper redistribution substrate 2000 may include the second protection layer 30, and the second protection layer 30 may include the fourth via hole VH4 exposing the conductive portion 980. The fourth redistribution pattern 410 may be provided on the second protection layer 30 to fill the fourth via hole VH4. The fourth redistribution pattern 410 may be in contact with the conductive portion 980.

The second semiconductor package PK2 may be configured to have substantially the same structure as the second semiconductor package PK2 described with reference to FIG. 1. The under-bump pattern 10, the first lower under-bump pattern 631, and the second lower under-bump pattern 632 may be configured to have substantially the same features as those described with reference to FIGS. 4 and 5. The second bonding pad 620, the fifth insulating layer 520, the fifth redistribution pattern 510, and the package coupling terminal 808 may also be configured to have substantially the same features as those described with reference to FIG. 1.

According to an embodiment of the inventive concept, a bonding pad may be in contact with an interconnection portion of an uppermost redistribution pattern without any via interposed therebetween, and thus, it may be possible to reduce a length of an electrical path from a semiconductor chip to an outer coupling terminal.

While example embodiments of the inventive concept have been particularly shown and described, it will be understood by one of ordinary skill in the art that variations in form and detail may be made therein without departing from the spirit and scope of the attached claims.

What is claimed is:
1. A semiconductor package, comprising:
a first redistribution substrate having a first surface and a second surface, which are opposite to each other;
a first semiconductor chip on the first surface of the first redistribution substrate; and
an outer coupling terminal on the second surface of the first redistribution substrate,
wherein the first redistribution substrate comprises:
a first insulating layer;
a first redistribution pattern in the first insulating layer, and includes an interconnection portion and a via portion; and
an under-bump pattern between the outer coupling terminal and the interconnection portion of the first redistribution pattern,
wherein the under-bump pattern has a third surface and a fourth surface, which are opposite to each other,
wherein the third surface of the under-bump pattern is in direct physical contact with the interconnection portion of the first redistribution pattern, and wherein the first insulating layer is in direct physical contact with an edge portion of the fourth surface of the under-bump pattern.

2. The semiconductor package of claim 1, wherein the first semiconductor chip comprises a chip pad, and
wherein the via portion of the first redistribution pattern is in direct physical contact with the chip pad.

3. The semiconductor package of claim 1, wherein the first insulating layer comprises at least one of photo-sensitive polyimide, poly(benzoxazole), phenol-based polymers, or benzocyclobutene-based polymers.

4. The semiconductor package of claim 1, wherein no via is interposed between the under-bump pattern and the interconnection portion of the first redistribution pattern.

5. The semiconductor package of claim 1,
wherein the first insulating layer is absent between the under-bump pattern and the first redistribution pattern.

6. The semiconductor package of claim 1, further comprising a second redistribution substrate, which is vertically spaced apart from the first redistribution substrate with the first semiconductor chip interposed therebetween,
wherein the second redistribution substrate comprises:
a second insulating layer;
a second redistribution pattern in the second insulating layer, and includes an interconnection portion and a via portion; and
a bonding pad on the interconnection portion of a topmost one of the second redistribution patterns,
wherein the topmost second redistribution pattern comprises a first metallic material and the bonding pad comprises a second metallic material different from the first metallic material,
the bonding pad has a fifth surface and a sixth surface, which are opposite to each other,
the fifth surface of the bonding pad is in direct physical contact with a top surface of the interconnection portion of the second redistribution pattern, and
the second insulating layer is extended to cover an edge portion of the sixth surface of the bonding pad and not cover a center portion of the bonding pad.

7. The semiconductor package of claim 6, wherein the second insulating layer is absent between the bonding pad and the second redistribution pattern.

8. The semiconductor package of claim 1, further comprising a second redistribution substrate, which is vertically spaced apart from the first redistribution substrate with the first semiconductor chip interposed therebetween, and a conductive pillar between the first redistribution substrate and the second redistribution substrate.

9. The semiconductor package of claim 1, further comprising a second redistribution substrate, which is vertically spaced apart from the first redistribution substrate with the first semiconductor chip interposed therebetween, a connection substrate having a hole between the first redistribution substrate and the second redistribution substrate, and a first molding structure that fills a region between the first semiconductor chip, and the connection substrate and between the first redistribution substrate and the second redistribution substrate.

10. A semiconductor package, comprising:
a first redistribution substrate having a first surface and a second surface, which are opposite to each other;
a first semiconductor chip disposed on the first surface of the first redistribution substrate to have chip pads facing the first surface of the first redistribution substrate; and outer coupling terminals on the second surface of the first redistribution substrate,
wherein the first redistribution substrate comprises:
a first insulating layer;
a plurality of first redistribution patterns, which are vertically stacked in the first insulating layer, and each of which includes a plurality of interconnection portions and a plurality of via portions; and
an under-bump pattern between a first outer coupling terminal and a first interconnection portion of one of the first redistribution patterns, which is adjacent to the second surface of the first redistribution substrate,
wherein a first via portion of an uppermost first redistribution pattern, which is adjacent to the first surface of the first redistribution substrate, is in contact with one of the chip pads,
the under-bump pattern has a third surface and a fourth surface, which are opposite to each other,
the third surface of the under-bump pattern is in contact with a bottom surface of a lowermost interconnection portion of one of the first redistribution patterns, which is adjacent to the second surface of the first redistribution substrate, and
the first insulating layer is extended to cover an edge portion of the fourth surface of the under-bump pattern.

11. The semiconductor package of claim 10, wherein a thickness of the under-bump pattern, in a direction perpendicular to the fourth surface of the under-bump pattern, is thicker than a thickness of the first interconnection portion of the lowermost first redistribution pattern.

12. The semiconductor package of claim 10, wherein a thickness of the first redistribution substrate, measured from the fourth surface of the under-bump pattern, ranges from 40 μm to 60 μm, and
the first insulating layer comprises at least one of photosensitive polyimide, poly(benzoxazole), phenol-based polymers, or benzocyclobutene-based polymers.

13. The semiconductor package of claim 10, wherein the bottom surface of the first insulating layer is positioned at a lower level compared to the fourth surface of the under-bump pattern.

14. The semiconductor package of claim 10, further comprising a bonding pad between the under-bump pattern and the first outer coupling terminal,
wherein the bonding pad comprises:
a first metal pattern in contact with the fourth surface of the under-bump pattern; and
a second metal pattern in contact with the first outer coupling terminal,
wherein the under-bump pattern comprises a first metallic material, the first metal pattern comprises a second metallic material, and the second metal pattern comprises a third metallic material, the first, second and third metallic materials each being different from each other.

15. The semiconductor package of claim 14, a level of a lowermost surface of the first insulating layer is lower than a level of a lowermost surface of the second metal pattern.

16. The semiconductor package of claim 14, wherein the first interconnection portion and a second via portion of one of the lowermost first redistribution pattern, are connected to each other to form a single object, and
a level of a top surface of the first interconnection portion, which is vertically overlapped with the second via portion, is higher than a level of a top surface of the first interconnection portion, which is vertically overlapped with the bonding pad.

17. A semiconductor package, comprising:
a first redistribution substrate having a first surface and a second surface, which are opposite to each other;
a first semiconductor chip on the first surface of the first redistribution substrate; and
an outer coupling terminal on the second surface of the first redistribution substrate,
wherein the first redistribution substrate comprises:
a first insulating layer; and
a first redistribution pattern in the first insulating layer, and includes an interconnection portion and a via portion; and
an under-bump pattern between the outer coupling terminal and the interconnection portion of the first redistribution pattern,
wherein the under-bump pattern has a third surface and a fourth surface, which are opposite to each other,
wherein the third surface of the under-bump pattern is in direct physical contact with the interconnection portion of the first redistribution pattern,
wherein the fourth surface of the under-bump pattern is in direct physical contact with the outer coupling terminal, and
wherein the fourth surface of the under-bump pattern is embedded by the first insulating layer.

18. The semiconductor package of claim 17, wherein the fourth surface of the under-bump pattern is positioned at a first level that is higher than a second level of the bottom-most surface of the first insulating layer.

19. The semiconductor package of claim 17, wherein an edge portion of the fourth surface of the under-bump pattern is covered by, and in direct contact with, the first insulating layer.

20. The semiconductor package of claim 17, wherein the first insulating layer comprises at least one of photo-sensitive polyimide, poly(benzoxazole), phenol-based polymers, or benzocyclobutene-based polymers.

* * * * *